United States Patent
Stevens

(10) Patent No.: US 10,112,372 B2
(45) Date of Patent: Oct. 30, 2018

(54) DEVICE AND METHOD FOR PRODUCING COMPOSITE SHEETS WHILE FORMING A VACUUM BAG

(71) Applicant: SM Innotech GMBH & Co. KG, Bocholt (DE)

(72) Inventor: Hans Gerd Stevens, Bocholt (DE)

(73) Assignee: SM Innotech GMBH & Co. KG, Bocholt (DE)

( * ) Notice: Subject to any disclaimer, the term of this patent is extended or adjusted under 35 U.S.C. 154(b) by 0 days.

(21) Appl. No.: 14/776,169

(22) PCT Filed: Mar. 13, 2014

(86) PCT No.: PCT/EP2014/054991
§ 371 (c)(1),
(2) Date: Sep. 14, 2015

(87) PCT Pub. No.: WO2014/140196
PCT Pub. Date: Sep. 18, 2014

(65) Prior Publication Data
US 2016/0031202 A1      Feb. 4, 2016

(30) Foreign Application Priority Data
Mar. 13, 2013   (DE) .......................... 10 2013 204 338

(51) Int. Cl.
*B32B 37/10*  (2006.01)
*B32B 17/10*  (2006.01)
(Continued)

(52) U.S. Cl.
CPC ............ *B32B 37/1018* (2013.01); *B30B 5/02* (2013.01); *B30B 5/06* (2013.01);
(Continued)

(58) Field of Classification Search
CPC ..... B32B 37/1018; B32B 37/14; B32B 37/06; B32B 17/10036; B32B 17/10761;
(Continued)

(56) References Cited

U.S. PATENT DOCUMENTS 6,547,910 B1 * 4/2003 Benzing ................ B29C 43/184
156/212
2010/0018646 A1   1/2010 Metzger et al.
(Continued)

FOREIGN PATENT DOCUMENTS

DE       3129206 A1    3/1983
DE       4222262 A1    3/1993
(Continued)

OTHER PUBLICATIONS

Translation of EP 2236287 A2, Inventor Hans Gerd Stevens, Oct. 6, 2010.*

*Primary Examiner* — George R Koch
(74) *Attorney, Agent, or Firm* — Wolf, Greenfield & Sacks, P.C.

(57) ABSTRACT

A device for producing composite sheets, in particular laminated glass plates, is proposed, comprising: an evacuating device (1), a vacuum-tight transporting surface (16) for conveying the sheets (6, 19, 20) to be laminated into the evacuating device and for conveying the sheets out of the evacuating device, and a vacuum-tight release sheet (14) that is transported along with the transporting surface, wherein the sheets to be laminated are placed between the transporting surface and the release sheet, characterized in that a seal (5) that runs around the sheets, is transported along with them and can be released is provided on the transporting surface and/or on the release sheet and allows an evacuation of the space between the transporting surface and the release sheet and thus allows a vacuum bag (18) containing the
(Continued)

sheets to be formed in the evacuating device. A corresponding method and a corresponding vacuum bag (18) are likewise disclosed.

16 Claims, 3 Drawing Sheets

(51) Int. Cl.
  *B30B 5/02* (2006.01)
  *B30B 5/06* (2006.01)
  *B32B 37/06* (2006.01)
  *B32B 37/14* (2006.01)
  *H01L 31/048* (2014.01)

(52) U.S. Cl.
  CPC .. *B32B 17/10036* (2013.01); *B32B 17/10761* (2013.01); *B32B 17/10844* (2013.01); *B32B 37/06* (2013.01); *B32B 37/14* (2013.01); *H01L 31/0488* (2013.01); *Y02E 10/50* (2013.01)

(58) Field of Classification Search
  CPC ....... B32B 17/10844; B30B 5/06; B30B 5/02; H01L 31/048; Y02E 10/50
  USPC .......................................... 156/64, 378, 379
  See application file for complete search history.

(56) References Cited

U.S. PATENT DOCUMENTS

| 2010/0038022 A1* | 2/2010 | Lapelosa | B41F 17/006 |
| | | | 156/238 |
| 2012/0318438 A1 | 12/2012 | Muschiol | |

FOREIGN PATENT DOCUMENTS

| DE | 10 2008 030 927 A1 | 10/2009 |
| DE | 10 2009 048999 A1 | 7/2010 |
| DE | 10 2009 002023 A1 | 10/2010 |
| EP | 0521438 A1 | 1/1993 |
| EP | 2236287 A2 | 10/2010 |

\* cited by examiner

DEVICE AND METHOD FOR PRODUCING COMPOSITE SHEETS WHILE FORMING A VACUUM BAG

This application is a 371 of PCT/EP2014/054991, filing date Mar. 13, 2014.

The present invention relates to a device and a method for producing composite sheets, in particular composite glass plates, with the aid of a re-usable vacuum bag, as well as to this type of vacuum bag.

PRIOR ART

Composite glasses generally consist of at least two glass plates and a composite film which is positioned between the plates. This structure is, for example, pre-laminated by means of pressure and temperature using a rolling method, and is subsequently completed in the autoclave. During this process the composite glass must be removed from the conveyor belt and be repacked into the autoclaves, and this takes place manually. Alternatively, composite glasses can be produced by the so-called vacuum bag method. Here the composite glasses are packed in a closed bag which in turn is evacuated by means of a vacuum pump. When the evacuation is complete, the evacuated bag is heated in an oven so that the composite glass is produced by means of temperature and air pressure. Here too the sheets of glass to be connected must be packed by hand into the bags and these are transferred into the oven. After heating, cooling takes place, the bags are opened and the composite sheets are removed. The bags are disposed of.

The repacking and packing of the composite glasses is disadvantageous in both methods because due to this, production flow in a line, i.e. in particular in the continuous process, is not possible. Furthermore, the vacuum bags can be damaged during repacking. The sheets of glass can also be damaged by the required handling. It is also a disadvantage that a long evacuation time is additionally required in the vacuum bag method because upon achieving a vacuum, at the same time the atmospheric pressure compresses the glasses and it becomes more difficult to eliminate air—as a result of which edges can be pressed together on the border of the glasses when subsequently fusing in the oven. Finally, the non-reusable vacuum bags place an additional strain upon the environment and are associated with significant cost (up to € 1500 per bag).

DESCRIPTION OF THE INVENTION

It is therefore the object of the present invention to provide a device and a method for producing composite sheets wherein the composite sheets can be produced by the continuous process (in a line) and, moreover, wider control possibilities are made possible during production, in particular the control and monitoring of previously non-controllable production parameters. This type of device is defined in claim 1, while a corresponding method is the subject matter of claim 10. The re-usable vacuum bag according to the invention is the subject matter of claim 16.

A device according to the invention for producing composite sheets, in particular composite glass plates, comprises an evacuating device, a vacuum-tight transporting surface for conveying the sheets to be laminated into the evacuating device and for conveying the sheets out of the evacuating device, and a vacuum-tight release sheet that is transported along with the transporting surface, the sheets to be laminated being placed between the transporting surface and the release sheet. The device according to the invention is characterized in that a seal or sealing that runs around the sheets, is transported along with them and can be released is provided on the transporting surface and/or on the release sheet and allows evacuation of the space between the transporting surface and the release sheet and thus allows at least one vacuum bag containing the sheets to be formed in the evacuating device.

In this connection transporting surface means any transporting means that can accommodate the sheets to be laminated and transport them along the device, in particular through the evacuating device, i.e. for example transporting plates, transporting belts etc. Depending on the application, the transporting surface can be rigid, flexible and/or elastic here, but what is important is that they are made to be vacuum-tight. A "seal" in the sense of the invention is not only to be understood to be a separate sealing means (e.g. a rubber frame or an applied liquid adhesive), but can also indicate a property of the transporting surface or of the release sheet, in other words, the surface of the transporting surface and/or of the release sheet is to be made such that when they come into contact with one another, the surfaces that touch generate the sealing effect to the outside. This is the case, for example, with silicone-coated materials or materials that contain silicone. In addition, the seal can bring about sealing either as a line seal or as a surface seal, the latter being preferred because it generates along its "width" a less strong pressure gradient between the inside of the vacuum bag and the surroundings than line seals.

The vacuum bag is thus formed by means of the seal from the transporting surface and the release sheet that is transported along with it. If the vacuum bag formed by evacuating the space between the transporting surface and the release sheet is now exposed to atmospheric pressure, e.g. by aerating the evacuating device, the transporting surface and the release sheet are pressed against one another due to the vacuum existing between them and this strengthens the seal. The vacuum bag produced in this way can now be further processed as one pleases, in particular the introduction of heat and pressing can take place, as can any subsequent processing steps such as controlled cooling, all without aerating the vacuum bag and so without any loss of the vacuum that degasses the sheets. Therefore, production parameters that are inaccessible or can only be accessed with difficulty in the prior art can be selectively controlled. In other words, the sheets are enclosed vacuum-tight in the evacuating device and can be conveyed into additional production units in a vacuum; the vacuum is "transported along with them". When the processing is complete, i.e. when the sheet composite is finished and the vacuum around the sheets is no longer required, the seal can be released and removed, while the transporting surface and the release sheet are ready for a new process cycle.

This is also the essential difference in comparison to the example of lamination devices such as that of Patent DE 10 2009 002 023 wherein a stack of components (generally a number of sheets and films to be laminated, for example for solar panels) is accommodated between a release sheet and a pressing membrane that can be passed through the pressing chamber 2 of the laminator and which presses the stack against the heated chamber wall while evacuating, for example, the chamber part lying above. The vacuum pocket formed here is limited to the inside of the laminator, and so cannot be moved out without destroying the vacuum surrounding the sheets.

The essential financial advantages of the device according to the invention are that the composite (e.g. composite glass) can now be produced in a line without any risks associated with transport and production because the vacuum can be maintained along the entire production line. Consumables are also dispensed with as regards the vacuum bags to be produced because the transporting surface and the release sheet as well as the seal are re-used, and there is no longer any of the laborious packing and unpacking of the laminate glass laminates. The fixing of the sheets (glasses) in a vacuum takes place until the end of the process chain, i.e. e.g. until cooling is complete, and this provides process reliability.

By means of the vacuum phase in the evacuating device the PVB film lying between the sheets, for example, is moreover dehumidified—the latter now no longer necessarily needs to be climatized or pre-dried. Therefore, climatized chambers or spaces for the storage and processing of the PVB film are no longer required.

Finally, by means of the "vacuum that is also transported", the cycle times on the production line can be reduced because the production process can be split up, for example, into the areas of pre-laminating, final laminating and cooling. By means of the temperature-, vacuum- and forming pressure control in the laminator, high-quality composite glasses can be produced, for example without any air inclusions or pressing together of the edges.

According to the present invention a vacuum-tight transporting or conveyor belt suitable for transport and evacuation can preferably be used as the transporting surface, in particular a circulating endless belt or a belt that is unwound from a roll and then wound up again. The latter can be made in the form of a one-way belt or, however, be a multi-directional belt that can preferably be cleaned after the end of the process. Such transporting belts are often made up of belt segments that are connected with tow rods. During evacuation or lamination the tow rods are located outside of the respective chamber. The release sheet can likewise be provided as an endless belt or from the roll, or however only as a "discreet" upper vacuum bag limit transported along with the transporting surface and of appropriate size (in particular all of the sheets lying on it must be covered). The release sheet is preferably made of temperature-resistant, elastic material here.

In one version it is conceivable to lay the seal around a stack of sheets (for example two glass sheets with a PVB film laid between them, all of which are to be combined to form composite glass), or to position it around a number of stacks. In this way the production risk can be varied.

For the evacuation it is conceivable to seal the evacuating device air-tight and to evacuate the chamber which is thus formed. In this way the sheets conveyed over the transporting surface can be degassed and dehumidified. In another possible embodiment the evacuating device comprises a lance with the aid of which the space between the transporting surface and the release sheet can be evacuated. For example, on an appropriately formed seal, for example a sealing frame positioned between the transporting surface and the release sheet, a valve can be provided onto which the lance docks so as to thus evacuate the space between the release sheet and the transporting surface. Thus, the evacuating device can be configured in a particularly simple manner.

Preferably, the evacuating device is a lamination device with a sealable vacuum chamber that can be evacuated and aerated and which comprises a (vacuum-tight) pressing membrane which is configured such that it can lie on the vacuum bag and seal the latter further, preferably by pressing. For example, the pressing membrane lies over the release sheet here and presses the vacuum bag against the lower chamber wall. In this way, by controlling the pressure between the vacuum-tight pressing membrane and the (in the example upper) chamber wall, the membrane can be laid over and pressed onto the vacuum bag in such a way that the sealing effect of the seal is improved, and so a vacuum bag that is sealed in a particularly stable manner is produced. In addition, such vacuum bags can now also be formed the sheets of which are stacked very high one on top of the other and so normally make it difficult to close/seal the bag along the seal. Instead of a pressing membrane, the advantage of which is adaptation to different surface geometries, a pressing plunger which has a contour adapted to the respective item being pressed is also conceivable. These types of lamination device with a pressing tool (pressing membrane, pressing plunger and similar) can be used after or in addition to the sealing, and also directly for the lamination—for example—of cold cross-linking two-component composites such as Plexiglass plates with which the two-component system is kept under pressure for, for example, 10-15 minutes.

Particularly preferably, the aforementioned lamination device further comprises at least one heating plate, due to which the laminator is now also suitable for thermally cross-linking composite materials or those which are to be pressed. With this configuration it is therefore possible to achieve not only the degassing of the sheets or the composite film and the formation of the vacuum bag by evacuating the vacuum chamber, but also to bring about the lamination of the sheets at the same time or subsequently by the pressure-controlled pressing of the sheets located in the vacuum bag against the heating plate and so to continue the formation of the sheet composite. For this purpose the pressing pressure and the temperature can be suitably regulated, for example in order to press together the edges of the sheets without reducing quality. Advantageously, for this regulation the vacuum chamber (pressing chamber) is to be subdivided into two chamber areas by the pressing membrane, which chamber areas can each be selectively subjected to pressure (evacuated/aerated).

In one inexpensive embodiment the seal comprises a sealing frame laid over the release sheet and which is suitable for sealing the release sheet with respect to the transporting surface by its own weight. In this connection the use, for example, of a liquid or pasty sealing means, which are designed for one-off use, as a seal can be dispensed with, and this saves on cost. Since the sheets in the vacuum bag formed in this way still lie over the transporting surface, however, they can still be transported along with the transporting surface and be delivered to subsequent process stations while maintaining the vacuum in the bag, i.e. with the previously generated pressure and/or temperature parameters and so under the optimal degassing conditions.

In one preferred embodiment the seal is provided as sealing means between the transporting surface and the release sheet. The advantage of this configuration is that the sealing capabilities are affected by the choice of seal, which at the same time must rest against the surface of the transporting surface and of the release sheet, forming a seal, and so a larger choice of materials (and material parameters) must be available for the transporting surface and the release element as regards the seal to be achieved in order to adapt the seal to the loads to be expected (due to the vacuum or due to additional mechanical loads generated by subsequent processing). The seal can be chosen here, for example, from:

an applicable butyl sealing compound, an applicable silicone sealing compound, in particular two-component systems such as addition cross-linking RTV-2 silicone rubbers, fluoroelastomers such as FKM/FPM, EPDM, silicone, rubber, a UV-cross-linking sealing compound, a re-usable adhesive, a one-way adhesive strip, a mechanically couplable seal, a labyrinth seal or a sealing strip.

The seal can also be provided as a sealing frame between the release sheet and the transporting surface, as already mentioned at the start in connection with the lance.

Preferably, the device comprises an application station for application of the seal onto the transporting surface and/or the release sheet upstream of the evacuating device. By providing this type of station the seal can be adapted optimally to the arrangement of the sheets lying on the transporting surface and, if so required, their position can be corrected before formation of the air bag in the evacuating device takes place.

According to an alternative embodiment the seal is a component part of the surface of the transporting surface and/or of the release sheet so that when they are in contact with one another the surfaces touching generate the sealing effect to the outside. Examples of suitable materials for the transporting surface and the release sheet are fluoroelastomers (FKM/FPM), EPDM, silicone, rubber. Furthermore, it is conceivable to provide the seal as a sealing profile or adhesive surface on the surface of the transporting surface and/or the release sheet.

In another embodiment the transporting surface comprises a vacuum-tight, removable carrier plate carried along by the evacuating device for supporting the sheets. This is particularly advantageous in those processing operations where an increased mechanical effect upon the sheets and the vacuum bag is provided, in particular with very large weights of the pressed item and in cases where the vacuum bag is to be taken from the machine.

Alternatively, the transporting surface can be a circulating transporting belt and comprise circulating metal sheets carried along by the evacuating device. In this way very heavy composites can be produced inexpensively "on the conveyor belt". Such metal sheets can also be molded or bent in order to comply with specific surface geometries (bends), as for example in the production of composite glass for motor vehicles (car glass).

According to a second aspect the invention provides a method for producing composite sheets, in particular composite glass plates, that comprises the following steps: inserting the sheets between a vacuum-tight transporting surface and a vacuum-tight release sheet that moves along with the latter; providing a seal that runs around the sheets, is transported along with them and can be released on the transporting surface and/or on the release sheet; evacuating the space between the transporting surface and the release sheet and forming a vacuum bag containing the sheets.

The insertion here also means those steps in which the sheets are first of all placed on the transporting surface and are then covered with the release sheet. The provision of the seal can take place before, during or after positioning the sheets, but in any case before covering with the release sheet. It is also conceivable for the seal to be provided permanently on the transporting surface or on the release sheet. The vacuum bag is thus formed by obtaining the seal from the transporting surface and the release sheet that is transported along with it. By this method the advantages already described in connection with the device according to the invention can be achieved, in particular with regard to any further processing (introduction of heat and/or pressing), and also with regard to downstream stations (controlled cooling), all without aeration of the vacuum bag and so loss of the vacuum that degasses the sheets.

Particularly preferably, the method comprises the step of sealing the vacuum bag, in particular with the aid of a pressing membrane which is laid over the vacuum bag in the course of or after evacuation. As mentioned in connection with the device according to the invention, instead of a pressing membrane, a pressing plunger or a pressing tool in general can also be used which has a contour adapted to the respective pressed item. This method is thus suitable for the lamination, for example, of cold-cross-linking two-component composites such as Plexiglass plates where the two-component system is kept under pressure for, for example, 10-15 minutes.

After completion of the sheet composite the seal can be released and, if so required, be removed, while the transporting surface and the release sheet are ready for a new process cycle. Due to the re-usability of the materials forming the vacuum bag (transporting surface, release sheet and seal) substantial costs can be saved in the production of the sheet composite.

A film made of e.g. PVB or other lamination films is generally inserted between the sheets. In principle, however, other lamination agents can also be used which can also be a component part of the sheets. The sheets can be, for example, sheets of glass for the production of composite glass, but also components of solar cells for the formation of solar modules or displays made of plastic plates.

Preferably, the method comprises the additional step of heating the sheets located within the vacuum bag. Here, heating during evacuation can on the one hand be used, by means of which the degassing and dehumidifying of the sheets can be assisted. On the other hand, heating downstream of the evacuation can additionally be used in order to reach the lamination temperature.

In one particularly preferred embodiment, when evacuating the space between the transporting surface and the release sheet, the humidity of the evacuated air is measured and the evacuation period is regulated accordingly. Since the composite films often have different degrees of humidity, for example due to different storage, measurement of the humidity allows one to determine the residual moisture in the composite film and prevents excessive drying during the evacuation.

The method according to the present invention can also preferably comprise additional steps such as the pressing of the sheets in the vacuum bag, with or without the addition of heat, the subsequent controlled cooling, preferably in a cooling station, or excess pressure treatment, for example in a hydraulic excess pressure station. By means of these steps of the formation of the vacuum bag that can be carried out in separate stations, more efficient timing can be achieved, and so the overall cycle length can be reduced, and one can thereby fall back on extremely cost-effective vacuum bags because they can be re-used.

WAYS OF IMPLEMENTING THE INVENTION

Figure 1A:
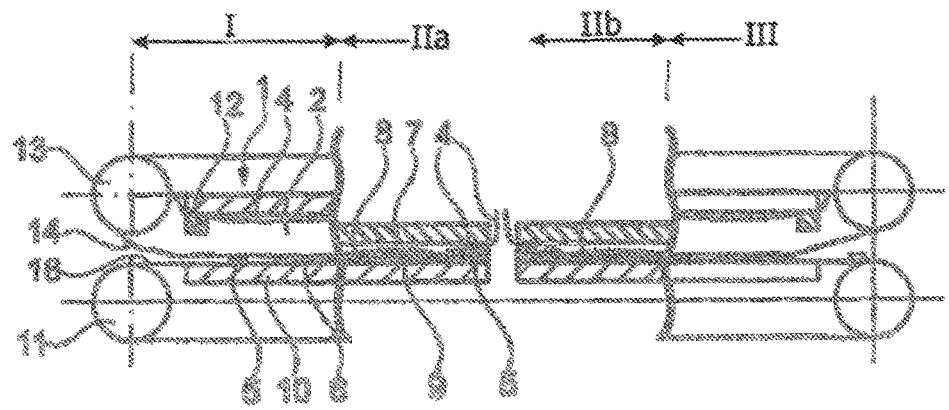
FIG. 1 shows a diagrammatic sectional illustration of a first embodiment of the invention with a laminator in different procedural steps, FIG. 1a) showing the evacuation of the space between the transporting belt and the release sheet in order to form the vacuum bag and the pressing of the sheets located within the vacuum bag, and FIG. 1b) additionally showing the conveyance of sheets of glass on a transporting belt into the laminator as well as the opening of the vacuum bag and the conveyance of the composite produced in this way out of the laminator.

FIGS. 1a) and 2a) show a diagrammatic side sectional view of an embodiment of the device and of the method for producing composite sheets. In this example sheets of glass with PVB film laid between them are used as sheets (FIG. 2a) which are to be pressed to form composite glass plates. FIGS. 1a) and 1b) show a laminator 1 as an evacuating device which defines a vacuum chamber 2 (pressing chamber) between its upper wall 7 and its heated lower wall 10. The vacuum chamber 2 further comprises a (vacuum-tight) pressing membrane 4 and is sealed at the edge of the laminator by a chamber seal 12 with respect to the surroundings. A transporting belt 16 is guided through the vacuum chamber 2 as a transporting surface, which transporting belt is in this instance configured as an endless belt running around a roller 11. Over the latter a release sheet 14, also in the form of an endless belt running round a roller 13, is guided through the vacuum chamber 2 of the laminator 1.

Figure 1B:
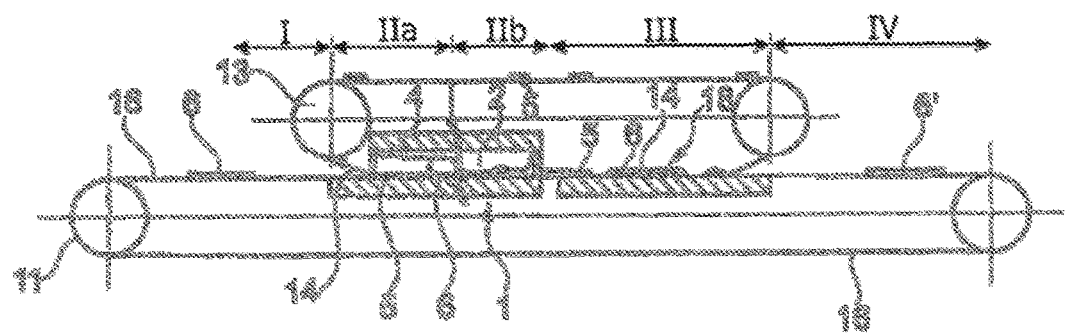

As can be seen on the left-hand side of FIG. 1b) (phase I), sheets of glass 6 (19, 20) with PVB composite film 21 laid in between are laid on the transporting belt 16 before being moved into the laminator, which plates of glass are subsequently (phase IIa) surrounded on all sides by a silicone seal 5 provided on the release sheet. As is also shown in FIG. 1b), the seals 5 are arranged regular distances apart on the release sheet 14. In this exemplary embodiment the silicone seals 5 are applied securely to the release sheet. They are self-adhesive, i.e. they adhere to the transporting belt 16 without any further measures by contact and can be detached from the latter again. The sheets of glass 6, which are not yet laminated, are conveyed into the pressure-controllable laminator 1 and in phase IIa, after the latter has been closed, are initially heated here and evacuated up to a specific pressure that ensures, for example, the discharge of humidity from the PVB composite film 21, but prevents the plasticizer from evaporating.

Figure 2A:
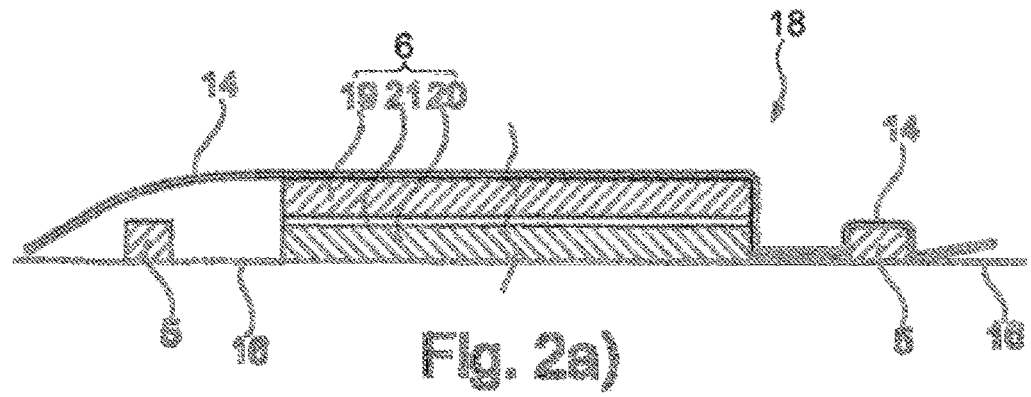
FIG. 2 shows a detailed view of the formation of the vacuum bag, on the left prior to evacuation, and on the right afterwards, also in section, FIG. 2a) showing an embodiment with the seal laid in between and FIG. 2b) showing an embodiment with the sealing frame laid over the top.
Figure 2B:
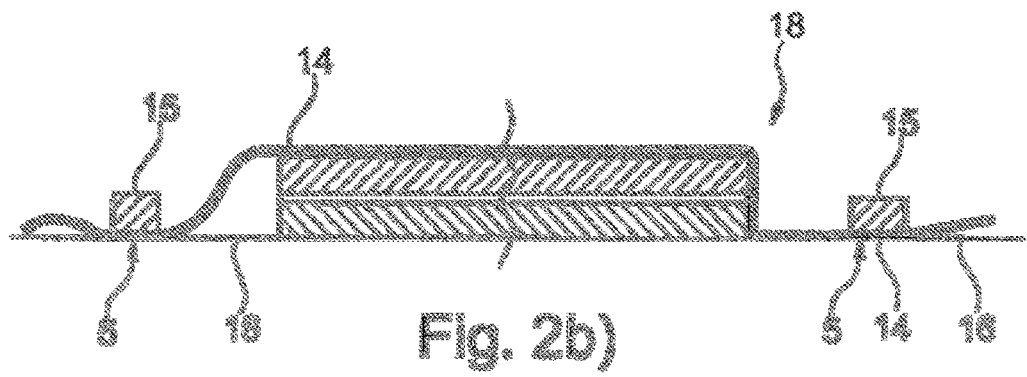

As shown in more detail in FIGS. 2a) and 2b) (in the left half of the figures the state prior to evacuation, and in the right half the state after evacuation is illustrated), there is located beneath the composite glass 6 (sheets of glass 19 and 20) a vacuum-tight transporting belt 16 and over the composite glass 6 (19, 20) there is a vacuum-tight release sheet 14 that is transported with and moves with the transporting belt, both of which now form an air-tight vacuum bag 18 upon evacuation by means of the self-adhesive silicone seal 5. In the process the pressing membrane 4 drops onto the release sheet 14 within the laminator 1 and in this way assists the formation of the vacuum bag (FIG. 1b, phase IIa). This means that the glass laminate 6 (19, 20, 21) is now enclosed, vacuum-tight, between the release sheet 14 and the transporting belt 16. FIG. 2a) shows the case of a seal 5 inserted between the release sheet 14 and the transporting belt 16, while FIG. 2b) shows the case with a sealing frame 15 placed over the release sheet 14. The seal is formed here by surface pressure between the release sheet 14 and the transporting belt 16.

Figure 3:
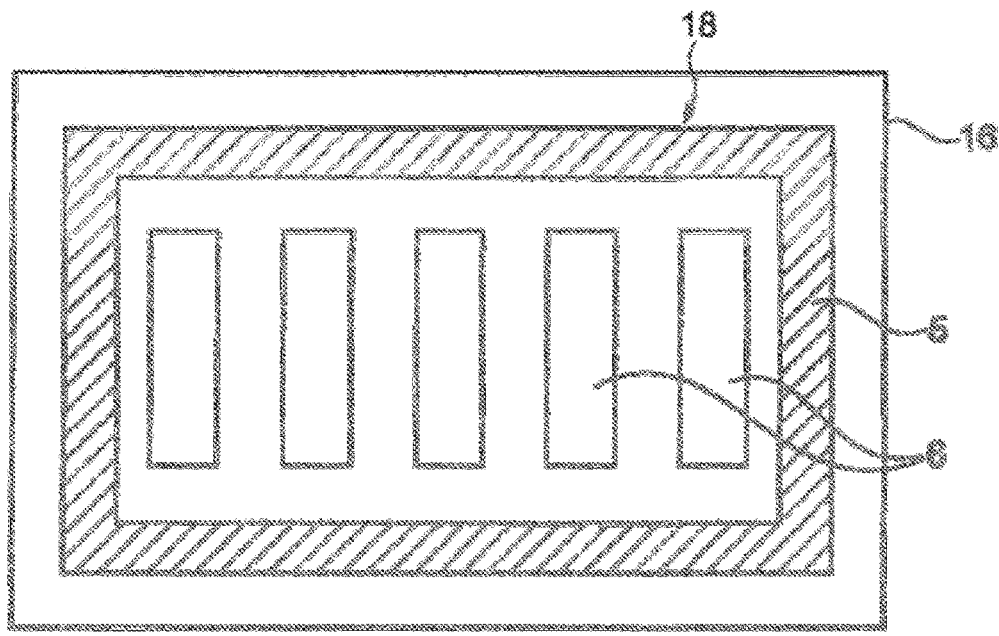
FIG. 3 shows a top view of the arrangement of sheets of glass, seal and transporting belt or transporting plate according to another embodiment of the invention.

As an alternative embodiment FIG. 3 shows the case where a number of glass laminates 6 on a transporting surface in the form of a carrier plate 16 are surrounded by a seal 5 acting as a surface seal and so together are enclosed, vacuum-tight, within the vacuum bag 18.

After the process parameters with regard to evacuation have been reached, in phase IIb the lamination of the two glasses 19, 20 of the stack 6 now takes place by pressure-controlled pressing (not necessarily with the entire atmospheric pressure) with the membrane 4 of the laminator. In the process the pressing force and the temperature of the heating plate 10 (integrated into the chamber wall) are regulated so that the edges of the glass are pressed together, but quality is not reduced. A pressing force of the membrane 4 can be freely selected because the laminator has a pressure-resistant overall housing, but is divided correspondingly into two vacuum chamber parts 8, 9 by the membrane 4 (see FIG. 1a).

After the pressing the chamber 2 of the laminator is aerated in order to discharge the composite glasses (phase III) without the laminate 6 of the glasses 19, 20 itself being aerated. The vacuum bag which is now at atmospheric pressure from the outside is conveyed out of the laminator 1 and can now be cooled by the ambient air in a controlled manner, for example while maintaining the vacuum in the bag 18, so that there is no risk of the glass laminate 6 separating prematurely at the edge due to an adhesive force that is not yet sufficient. Alternatively, the glasses 19, 20 or the glass laminate 6' that is produced can be heated further in another oven in order to shorten the production cycle or be specifically cooled in a separate cooling station.

It is essential for the not yet finished stack of sheets 6 to be enclosed, vacuum-tight, in the vacuum bag 18 under selectable pressure conditions and to be able to be further processed, in particular pressed, in the latter, and to be conveyed into further production units. The composite 6 which is still unfinished can thus "transport its vacuum along with it". At the end of the production chain (at the end of phase III) the seal 5 is then released from the transporting belt 16, for example as shown by diverting the transporting belt 16 and the release sheet 14 over rollers, and so the vacuum bag 18 is opened and the composite glass 6', which is now complete, is released.

Figure 4:
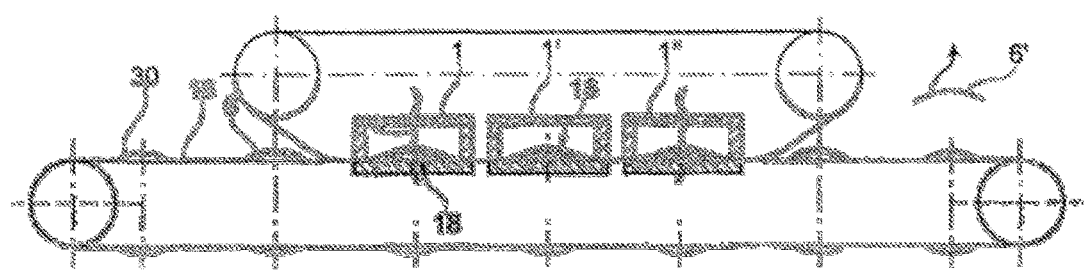
FIG. 4 shows an embodiment with molded transporting plates for the production of composite glass plates for cars, different phases of the processing being shown alongside one another.

FIG. 4 describes an embodiment which can be used, for example, in the production of glass for cars. In this connection a suitably shaped carrier plate 30 is provided on the transporting surface, here a transporting belt 16, onto which the shaped glasses 6 (i.e. a layer of individually shaped glasses and composite films) are placed and then covered with the release sheet 14. As in the embodiment described in FIGS. 1a) and 1b), the glasses inserted in this way are evacuated in a laminator 1, a vacuum bag 18 that contains them is formed and the laminate 6 located within the bag 18 is pressed. As shown here, purely as an example, the laminate 6 can subsequently be heated in a further oven 1' (circulating air oven) and finally be cooled in a cooling station 1" in a controlled manner.

Figures 5, 6:
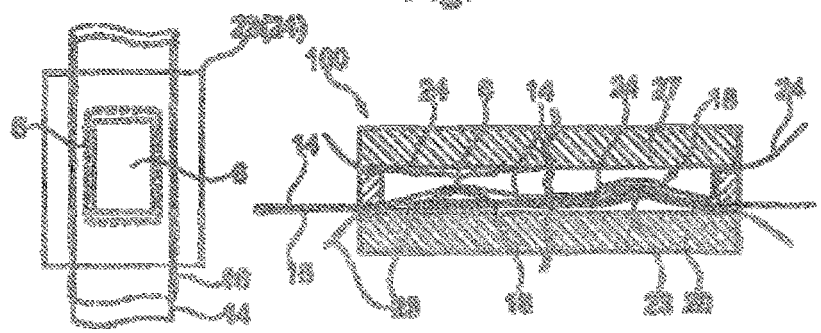
FIG. 5 shows a detailed view of the laminator from FIG. 4.
FIG. 6 shows a top view of the laminator chamber of FIG. 5.

Finally, FIG. 5 show another embodiment in which a lower pressing membrane 23 disposed beneath the transporting surface 16 (here a transporting belt) and an upper pressing membrane 24 disposed over the release sheet 14 are provided in the laminator 100. Both the pressing membranes 23, 24 and the transporting belt 16 and the release sheet 14 are made to be flexible and elastic in order to adapt their shape to the curved glass plates 6 to be laminated. Moreover, the release sheet 14 and the transporting belt 16 are coated with silicone in order to form a seal upon contact. First of all the space between the transporting belt 16 and the release sheet 14 is evacuated, as described above, the glass plates 6 are degassed, and the vacuum bag 18 is formed. Furthermore, FIG. 6 shows, for better understanding, a top view of the lamination device 100 from which one can see that a seal 5 is formed around the glass plates 6 by the contact of the release sheet 14 and the transporting belt 16 due to the vacuum that is created between them. The membranes 23 and 24 also surround the glass plates 6 and are wider than the release sheet 14 and the transporting belt 16, and so the membranes can effectively assist the sealing of the vacuum bag by resting on and against the latter.

Next, the space 28 between the upper chamber wall 27 and the upper pressing membrane 24 and between the lower chamber wall 20 and the lower pressing membrane 23 are selectively exposed to pressure, and the glass plates 6 are pressed between the membranes 23, 24. By adapting the membranes and the transporting belt and the release sheet to the shape of the glasses 6, very even and so optimal pressing can take place which considerably increases the quality of the composite glass. One can thus also produce composite glass plates for the stringent requirements of the automotive industry by the method according to the invention described here. Here too, it is also possible to shorten cycles by division into individual sub-steps, as already described.

The method described and the corresponding device can also be used to shorten cycles in the production of glass/glass solar modules. Here too, with conventional production methods there is the basic risk that the solar modules will "gape" or open at the edge after lamination and when being conveyed into the downstream cooling press and be joined again in the cooling phase—deficient joints often remaining visible however. Likewise, the production process can be divided into further production sub-steps, e.g. pre-laminating (e.g. in an evacuating device), laminating (e.g. in a laminator), cooling (e.g. in a cooling station)—all in a vacuum. Other composite materials such as EVA, FEVA, and in particular thermoplastic composite films such as silicones, TPUs, ionomers etc. can also be processed without any risk.

The invention claimed is:

1. A device for producing composite sheets, comprising:
an evacuating device,
a vacuum-tight transporting surface for conveying the sheets to be laminated into the evacuating device and for conveying the sheets out of the evacuating device, and
a vacuum-tight release sheet that is transported along with the transporting surface,
the sheets to be laminated being placed between the transporting surface and the release sheet,
wherein
a seal that runs around the sheets, is transported along with the sheets and can be released is provided on the transporting surface and/or on the release sheet and allows evacuation of the space between the transporting surface and the release sheet and thus allows a vacuum bag containing the sheets to be formed in the evacuating device, and
wherein a vacuum is maintained in the vacuum bag when the sheets are transported by the transporting surface out of the device.

2. The device according to claim 1,
the evacuating device comprising a lance with the aid of which the space between the transporting surface and the release sheet can be evacuated.

3. The device according to claim 1,
the evacuating device being a lamination device with a sealable vacuum chamber that can be evacuated and aerated and which comprises a pressing membrane which is configured such that it lies on the vacuum bag and seals the latter further by pressing.

4. The device according to claim 1,
the seal being formed by a sealing frame laid over the release sheet and which is suitable for pressing the release sheet onto the transporting surface by its own weight and thus sealing the vacuum bag.

5. The device according to claim 1,
the seal being provided as sealing means between the transporting surface and the release sheet.

6. The device according to claim 1,
the seal being selected from: an applicable butyl or silicone sealing compound, a sealing strip, a reusable adhesive, a one-way adhesive strip, a UV cross-linking sealing compound, a mechanically couplable seal, a labyrinth seal.

7. The device according to claim 1,
the seal being a component part of the surface of the transporting surface and/or of the release sheet so that when they are in contact with one another the surfaces touching generate the sealing effect to the outside, or is provided as a sealing profile or adhesive surface on the surface of the transporting surface and/or the release sheet.

8. The device according to claim 1,
the transporting surface comprising a vacuum-tight carrier plate carried along by the evacuating device for supporting the sheets.

9. The device according to claim 1,
the transporting surface being a circulating transporting belt and comprising a circulating sheet carried along by the evacuating device.

10. A method for producing composite sheets, comprising the following steps:
inserting the sheets between a vacuum-tight transporting surface and a vacuum-tight release sheet that moves along with the vacuum-tight transporting surface,
providing a seal that runs around the sheets, is transported along with the sheets and can be released on the transporting surface and/or on the release sheet,
evacuating the space between the transporting surface and the release sheet and forming a vacuum bag containing the sheets, and
wherein a vacuum is maintained in the vacuum bag when the sheets are transported by the transporting surface out of the device.

11. The method according to claim 10, further comprising the step of sealing the vacuum bag with the aid of a pressing membrane which is laid over the vacuum bag.

12. The method according to claim 10, after formation of the sheet composite the seal being released and the transporting surface and the release sheet transported along with it being re-used for the method for producing composite sheets.

13. The method according to claim 10, further comprising the additional step of heating the sheets located within the vacuum bag.

14. The method according to claim 10, further comprising the step of pressing the sheets in the vacuum bag, with or without the addition of heat.

15. The method according to claim 10, wherein,
   upon evacuating the space between the transporting surface and the release sheet, the humidity of the evacuated air is measured and the evacuation period and/or the vacuum pressure is adjusted as a function of the measured humidity.

16. A vacuum bag for producing a sheet composite, the vacuum bag being configured to contain sheets of the composite and consisting of a transporting surface that can be continuously conveyed through processing stations and a release sheet transported along with the sheets,
   wherein
   a releasable seal that is transported along is provided on the transporting surface and/or on the release sheet, and
   wherein a vacuum is maintained when the sheets are transported by the transporting surface and delivered to subsequent processing stations.

* * * * *